United States Patent [19] [11] Patent Number: 4,560,974
Coleman et al. [45] Date of Patent: Dec. 24, 1985

[54] REAL-TIME ORDINAL-VALUE FILTER UTILIZING REFERENCE-FUNCTION COMPARISON

[75] Inventors: Guy B. Coleman, Northridge; James W. Henderson, Woodland Hills; Jacob M. Sacks, Thousand Oaks, all of Calif.

[73] Assignee: Hughes Aircraft Company, El Segundo, Calif.

[21] Appl. No.: 575,107

[22] Filed: Jan. 30, 1984

Related U.S. Application Data

[63] Continuation-in-part of Ser. No. 306,256, Sep. 28, 1981, abandoned.

[51] Int. Cl.[4] ............................ G06F 7/06; G06K 9/00
[52] U.S. Cl. .................................. 340/146.2; 364/900; 382/36
[58] Field of Search .................... 340/146.2; 364/724, 364/200, 900; 382/30, 36, 37

[56] References Cited

U.S. PATENT DOCUMENTS

| | | | |
|---|---|---|---|
| 3,328,769 | 6/1967 | Lee, III | 364/900 |
| 3,505,653 | 4/1970 | Kautz | 364/900 |
| 3,587,057 | 6/1971 | Armstrong | 364/900 |
| 3,636,519 | 1/1972 | Heath | 364/900 |
| 3,829,664 | 8/1974 | Kashio | 340/146.2 |
| 3,927,391 | 12/1975 | Cantrell | 340/146.2 |
| 3,931,612 | 1/1976 | Stevens et al. | 340/146.2 |
| 4,101,968 | 7/1978 | Florence | 364/900 |
| 4,110,837 | 8/1978 | Chen | 364/900 |

*Primary Examiner*—Gary Chin
*Attorney, Agent, or Firm*—S. C. Durant; M. J. Meltzer; A. W. Karambelas

[57] ABSTRACT

Operating at real-time data rates, the disclosed hardware network generates a signal which closely approximates the Mth-largest of a set of R input data signals. The operational basis of this network is a comparison (121-127) between the input data (101-107) and a monotonically-scanning reference function (110). At that point (140, 150, 160) when the lower (R−M+1) of the inputs have been equaled by an increasing reference, the reference has become the same as the Mth-largest and is used (119b, 165, 170, 175) as the filter output. Analogous operation is achieved with a decreasing reference.

When the number R of inputs is odd and M is made equal to ((R+1)/2), the network becomes a real-time median filter.

8 Claims, 1 Drawing Figure

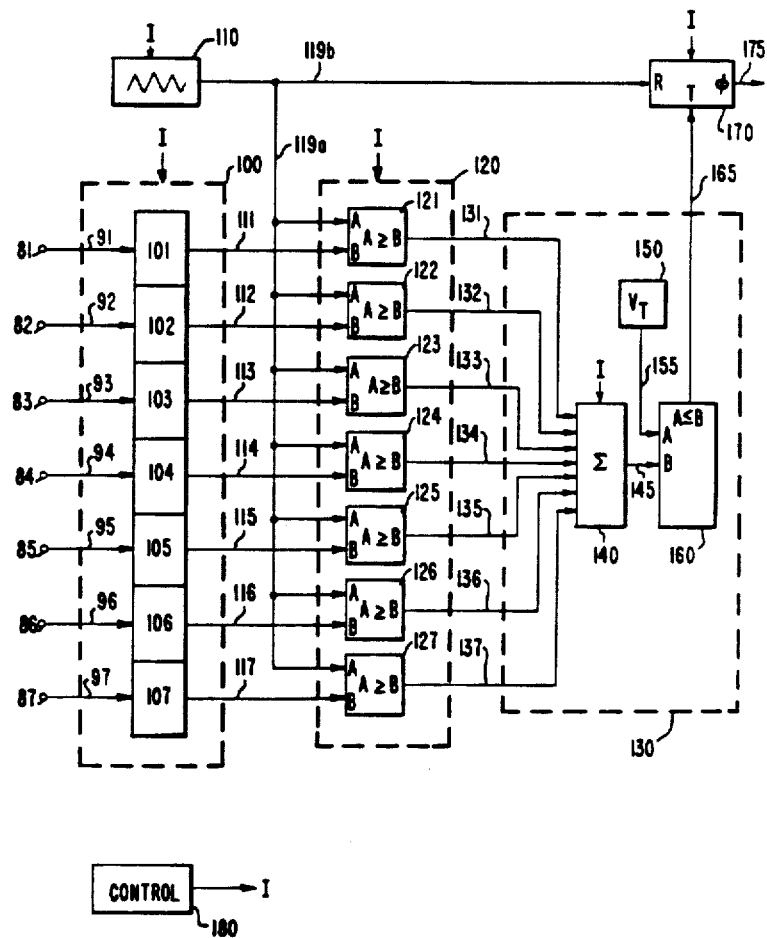

REAL-TIME ORDINAL-VALUE FILTER UTILIZING REFERENCE-FUNCTION COMPARISON

CROSS-REFERENCE TO RELATED APPLICATIONS

This is a continuation-in-part of patent application Ser. No. 306,256, filed Sept. 28, 1981, now abandoned.

Incorporated by reference into the parent application, and hence derivatively incorporated into the present specification, are the disclosures of the following related, common-assignee patent applications, co-pending with the parent application: Ser. No. 306,251 (now U.S. Pat. No. 4,441,165): "Real-Time Ordinal-Value Filters Utilizing Complete Intra-Data Comparisons;" Ser. No. 306,253 (now U.S. Pat. No. 4,439,840): "Real-Time Ordinal-Value Filters Utilizing Partial Intra-Data Comparisons;" and Ser. No. 306,279 (now U.S. Pat. No. 4,456,968): "Real-Time Ordinal-Value Filter Utilizing Half-Interval Ranking."

BACKGROUND OF THE INVENTION

1. Field of the Invention

The invention relates in general to signal-processing apparatus and in particular to networks for determining the Mth-largest value of an input data set. The invention has special relevance in those environments, such as image processing, where it is advantageous to perform this value determination in real time.

2. Description of the Prior Art

Presented here is the concept of an ordinal-value filter which determines which one of a set of R applied data values is the Mth-largest. When R is odd and M is made equal to $((R+1)/2)$, the Mth-largest becomes the "middle" value of the data set, having in general an equal number of other data values both larger than and smaller than itself. Such a middle value is designated the median. A median filter is one which determines or selects this median value from an input data set.

Although both the basic concept of the median filter and its use in the field of image processing are well-known, many prior realizations have depended upon time-consuming software routines.

Prior-art network concepts capable of being mechanized as hardware-economical, ordinal-value filters which perform the required determinations at the incoming data rate are presented by D. E. Knuth in Volume 3 of his book "The Art of Computer Programming: Sorting and Searching" (1973). See especially the odd-even transposition sorting networks given in Knuth's FIG. 58 on page 241.

It should be noted, however, that the inventions claimed in this specification are considered to be patentably different from Knuth's concepts, as well as from the network concepts and mechanizations presented in the incorporated applications.

A real-time ordinal-value-filtering capability is extremely useful, especially, for example, in those situations where the ordinal-value processing of dynamic images is of greatest value when it can be performed as the images are occurring.

SUMMARY OF THE INVENTION

It is an aim of this invention, therefore, to provide apparatus for determing the Mth-largest value of a set of input data values.

It is also an aim of this invention to provide apparatus for performing such determinations with a minimum amount of hardware.

It is another aim of this invention to provide minimum-hardware implementations which can perform such determinations efficiently in real time.

These and other aims are achieved by the disclosed invention which in one of its aspects provides a hardware mechanization for determining, at real-time data rates, which one of a set of R input data signals is the Mth-largest. The determination is based upon a comparison between the input data and a monotonically-scanning reference function. At that point when the lower $(R-M+1)$ of the input data signals have been equaled by an increasing scanning reference, the reference has become the same as the Mth-largest and is used as the filter output. Analogous operation is achieved with a decreasing reference. In another of the invention's aspects, the network becomes a real-time median filter when the number R of inputs is odd and M is made equal to $((R+1)/2)$.

BRIEF DESCRIPTION OF THE DRAWING

These and other objects and advantages will become apparent from a study of the following specification when considered in conjunction with the accompanying drawing in which:

The FIGURE shows a hardware network as an example implementation of the reference-comparison concept in which the monotonically-varying values of a scanning reference function are compared with all of the input data signals.

DETAILED DESCRIPTION OF THE INVENTION

I. The Reference-Comparison Network

A. Overview

Included within the general scope of the invention is the illustrative embodiment depicted in the FIGURE in which a set of input data signals from register 100 is compared by reference comparators 120 with a reference function from generator 110. This function monotonically scans over the entire range of values possible for the input data. Summation subnetwork 140 totals the number of comparators which have indicated equality between the reference function and the individual data values. When the reference function sweeps from the interval's lower end to its higher end, and when the comparator output voltages are of equal magnitude, the summation total provides an indication of when the reference function has become equal to the desired Mth-largest input value. For R applied data values, this upward-scan threshold summation level will be $(R-M+1)$ times the comparator output-signal magnitude. When threshold comparator 160 indicates that this threshold has been reached, sample-and-hold subnetwork 170 causes the reference function's threshold-trigger value to exit from the apparatus as the network's selection for the desired Mth-largest value.

B. Implementation Details

1. Input Storage Register

Input storage register 100 receives and stores a set of R subject data signals. The illustrative embodiment has provisions for processing an R-unit set of up to $R=7$ signals, with the individual elements of the signal set being held in subregisters 101 through 107. By biasing off an appropriate number of these subregisters, signal sets of different sizes can also be accommodated without impairing the effectiveness of the present embodiment's ordinal-value-determination operation.

In the example mechanization, the data signals are received at connections 81 through 87 from external sources not shown. As one of many alternatives still encompassed within the inventive concept, subregisters 101 through 107 could themselves be direct-sensing storage elements such as charge-coupled devices, thus eliminating the need for external source connections. Nevertheless, when in fact derived from external sources in accordance with the depicted example embodiment, the signals are carried over channels 91 through 97 into the respective subregisters. As implemented, the signals are analog values, and the subregisters are analog storage devices. (The processing of digital data stored in digital input registers will be discussed below.)

In another alternative still encompassed within the inventive concept, input register 100 could be an analog shift register having successive subregisters 101 through 107. Such a register could receive over channel 91 from connection 81 the individual elements of a serially-presented data stream. By means of either conventional timing and control techniques or an initialization signal to be described below, these individual data signals would be made to shift through the successive subregisters as subsequent data-stream elements were received.

In this shift-register configuration, the subject data sets whose Mth-largest value is to be formulated would be the successive R-unit clusters of data-stream elements as contained in the input register at any given time.

2. Reference Generator

Reference generator 110 produces on channel 119 a reference signal whose values scan over the entire range "T" of values which the input data might assume. In many instances it is convenient to arrange for the value scan to be monotonic over the interval of interest. For each given set of data values, the reference function is scanned from one end of the value interval to the other. For example, when the data can cover the positive values from zero to an upper limit T, a monotonically-*increasing* reference function would be scanned from zero through T. When the data can occur within the range of −(T/2) through +(T/2), the reference function would be scanned from −(T/2) through +(T/2). It is apparent that in a functionally-equivalent mechanization, the reference function could be made monotonically-decreasing, by scanning from the higher end of the value interval to the lower end.

In order to operate iteratively with a succession of input data sets, reference generator 110 could be configured to produce a *periodic* waveform which scans monotonically during each period. The period of the waveform would be chosen so that at least one monotonic value-scan occurs during the time when a subject data set is held in register 100. In an example mechanization, the periodic waveform chosen could be that of an analog sawtooth signal, continuous over the value interval of interest.

3. Reference Comparators

Each of the reference comparators 121 through 127 receives as one of its inputs the reference waveform from channel 119a. As its other input, each receives over channels 111 through 117 a unique one of the data values from the input storage register. Each comparator then compares the associated data value to the scanning reference signal.

As implemented, these comparators are analog devices whose output channels 131 through 137 remain inactive until the instant of substantial equality between the analog reference waveform and the given analog input data value. At that instant of equality, each comparator produces an affirmative comparison-output signal, such as a logic zero-to-logic one transition, which is sent to summation subnetwork 140.

In a functionally-equivalent digital mechanization, the comparators would be digital devices comparing digital data values from a digital input storage register with a digital reference signal produced by a digital reference generator such as a high-speed counter. If a digital application were to arise in which it was possible to tolerate more of a discrepancy between the outputted reference value and the true Mth-largest data value, the speed of the digital scanning reference function could be increased by setting the generator to produce greater-than-unity count increments for its value scan. In such an increased-speed situation, each comparator could be adjusted to activate its output line when an *increasing* reference function was either equal to or *greater* than the respective data value. The corresponding adjustment for the case of a *decreasing* reference would be an "equal to or *less* than" conditon.

4. Threshold Network

The filter includes a threshold network 130 which receives the comparison-output signals and in effect analyses them so as to determine whether they indicate that predeterminable threshold conditions have been satisfied. If so, the network generates an appropriate threshold-output indication. In the example illustrated embodiment, threshold network 130 includes summation subnetwork 140, selectable-threshold generator 150 and threshold comparator 160.

a. Summation Subnetwork

In one of its fundamental aspects, the present filter is directed toward selecting as its output that reference-function value which matches or approximates to within a desired degree of accuracy the Mth-largest value of a set of R input data signals. For a monotonically-*increasing* reference function, the reference will have reached the value of interest at that point in time when the lower (R−M+1) of the data values have been substantially equaled, in the sense of having been either actually equaled or instead surpassed by the scanning reference. For a monotonically-*decreasing* reference function, the reference will have reached the value of interest at that point in time when the upper M of the data values have been analogously equaled or passed by the scanning reference. (It may be noted parenthetically that the presence in a given signal set of equal data values may create a situation in which *more* than the indicated numbers of data-set signals are substantially equaled by the reference when it reaches the "true" Mth-largest value. As will become more apparent during the course of the subsequently-presented discussion concerning equal-data ambiguities, the existence of an *excess* number of reference-equaled data signals does not alter the fact that a *requisite* number is nevertheless still present. That the basic reference-selection action of the overall filter similarly remains substantially unaffected will also become evident from the ambiguities discussion.)

By accumulating the comparison-output signals presented on channels 131 through 137, conventional summation subnetwork 140 generates an output sum pattern which gives a direct indication of the number of input data values which have been equaled or surpassed by the monotonically-scanning values of the implemented increasing reference function. The reference-value-selection objective can thus be achieved in a readily-predeterminable fashion by monitoring and properly interpreting this output-sum pattern.

In the analog realization depicted in the FIGURE, the magnitudes of the individual comparison-output signals are made equal. When accumulated by an analog summation subnetwork, these signals cause an equal-step staircase waveform to be produced on output channel 145. The resulting equal-magnitude steps of the analog staircase provide the direct indication of the number of comparators whose respective analog data values have been at least equaled by an upwardly-scanning analog reference function.

In a substantially-equivalent digital mechanization, summation subnetwork 140 could be a read-only memory (ROM) which would output onto a digital-data-bus version of output channel 145 a digital indication of the number of reference comparators whose outputs had been activated by conditions of equality or excession between a digital reference function and digital data values. By analogy to the more-complete ROM-mechanization discussion presented in the above-incorporated "Complete-Comparison" application, a ROM could easily be made to achieve such operation by configuring it to receive, as memory addresses, appropriate digital-logic versions of the comparison-output signals. These comparison-output addresses would then access memory locations whose contents would be the appropriate number indications. (It is, of course, possible to use a digital summation subnetwork when the reference and data values are themselves analog, or to conversely use an analog summation subnetwork when the reference and data values are themselves digital.)

The output of the summation subnetwork will indicate that the reference has reached the value of interest when, if analog, the staircase waveform reaches the level of the $(R-M+1)$st step or when, if digital, the binary output reaches the value $(R-M+1)$, with either output form providing an Mth-largest ranking-condition indication that at least $(R-M+1)$ comparators have been activated. For a monotonically-decreasing reference function, the appropriate ranking quantities would respectively be the Mth step or the number M itself.

b. Selectable-Threshold Generator

Selectable-Threshold generator 150 produces a rank-count signal indicative of the example ranking quantity $(R-M+1)$. In the case of an analog mechanization, this rank-count signal could be the voltage level equal to $(R-M+1)$ times the magnitude of any one of the equal-magnitude comparison-output signals from comparators 121 through 127. This voltage level would be carried over channel 155 to comparator 160. In a digital mechanization, the rank-count signal could be the binary representation of the number $(R-M+1)$. In this situation, channel 155 would become a digital data bus having a sufficient number of lines to carry the individual bits of the resulting binary number.

c. Threshold Comparator

Threshold comparator 160 compares the summation-output signal received over channel 145 at input B with the threshold level received over channel 155 at input A. When input B has become at least equal to input A, with this condition thus indicating that at least the requisite Mth-ranking-condition number of comparators have become activated, the device activates its threshold-output channel 165 which then acts as a trigger signal for sample-and-hold subnetwork 170.

d. Threshold Substitution

In another fundamentally-equivalent mechanization of threshold network 130, the above-noted ROM could be configured not only to perform the functions of a summation subnetwork but also to obviate the necessity for both the threshold generator and threshold comparator. By further analogy to the likewise above-noted ROM-mechanization discussion, this "one-for-three" substitution could be achieved by specially coding the ROM. In accordance with this special coding, and once again utilizing digital-logic versions of the comparison-output signals as memory addresses, the device could be configured so that predetermined ones of its memory locations contained the representation for a first threshold-output signal, while the remainder of its memory locations contained the representation for a second threshold-output signal. (In an actual implementation these first and second signals could respectively be logic "one" and logic "zero.") The memory locations chosen for the first signal would be those whose ensemble comparison-output addresses correspond to comparison-output patterns which would satisfy the above-described digital threshold conditions. The complementary locations chosen for the second signal would be those for which the associated comparison-output patterns would *not* satisfy the described threshold conditions.

5. Sample-And-Hold Subnetwork

Over subchannel 119b, subnetwork 170 receives at input R all values of the montonically-scanning reference function. At input T is received the trigger signal produced by comparator 160 when the output of the summation subnetwork has become at least equal to the threshold ranking quantity. When triggered, network 170 passes onto output channel 175 that reference value which caused the requisite number of reference comparators to become activated. In a situation of relatively-slow data rates with a resulting relatively-long scanning period for the reference function, the reference value so sampled is an acceptable approximation to the desired Mth-largest data value. The resulting ordinal-output value is analog in the implemented network and would be a digital number in a digital mechanization.

6. Reinitialization

Once the appropriate reference value has been transmitted over channel 175, the example network can be prepared for the processing of a new set of data by an intialization signal "I" received from a conventional control unit 180. In addition to the register-100 serial initialization described above, this signal could typically be utilized to cause the existing value to be cleared from sample-and-hold subnetwork 170, to cause summation subnetwork 140 to be set to zero, and could additionally be utilized both to reset comparators 120 as well as to initiate or synchronize reference generator 110. For the case of data presented in parallel over channels 91 through 97, the initialization signal could be used to cause *all* existing data values in register 100 to be cleared, thereby preparing the register for the receipt of a new data-signal set.

II. Equal-Data Ambiguities

Included within the information incorporated at the beginning of this specification is a discussion, presented in the document entitled "Real-Time Ordinal-Value Filters Utilizing Complete Intra-Data Comparisons," concerning equal-data ambiguities. As explained more fully in that document, the presence of equal data values among the members of a given R-unit data set is considered to give rise to an ambiguity in that the equality creates a discrepancy between the number of *magnitudes* and the number of *signals* which the data set contains.

From the standpoint of terminology, such ambiguities are resolved by means of a special definition. In accordance with this definition, expressions such as "Mth-largest" (in the sense of the Mth-largest *magnitude*) are specially defined as being a designation for that data-set element which would occupy the Mth *position* in an ordered-by-magnitude listing of the set's data signals. (It will be apparent to those skilled in the art that for data sets of arbitrary value-intervals T, the subject Mth-largest expressions are more-precisely referenced with respect to *signed* set magnitudes. It is thus a data-set listing ordered by *signed* magnitude which more-generally establishes the framework for the subject Mth-position definition.)

From the standpoint of device operation, such ambiguities present in general no significant processing difficulties for hardware implementations of the present invention. It is in particular the typical "greater than" aspect of the conventional "equal to or greater than" thresholding function performed in the example mechanization by conventional threshold comparator 160 which enables the ambiguities to be processed without error and hence operationally resolved.

An explanation as to why the described thresholding feature leads to an error-free processing capability may conveniently be presented in the context of an operational example. Consider an elementary situation in which the processing objective was the ascertainment of the median value of a seven-member digital data set, an ordered listing of whose elements took the integer form (2, 6, 9, 12, 15, 18, 19). In this situation, R = 7, M = ((R + 1)/2) = 4, and the desired median value would be the integer 12. With a monotonically-increasing function serving as the reference, the associated threshold would be $(R - M + 1) = 4$. Furthermore, assume that the reference generator was configured to scan in unit increments over a data-value interval T of 0 through 20, and that an activated comparator output represented a unit value. An initial consequence of these conditions is that only one of the comparators 121–127 would become activated when the reference reached the correct value of 12, and hence that exactly four comparators total would be activated at that time. The resulting summation signal generated by subnetwork 140 and applied to input B of threshold comparator 160 would thus be exactly equal to the threshold level 4 derived from generator 150 and applied to the associated input A. Output line 165 would accordingly become activated upon the occurrence of this condition of exact equality.

Suppose in contrast that the data set took the form (2, 6, 9, 12, 12, 18, 19), all other example conditions remaining the same. In this case, the transition of the reference function from the value 11 to the "target" median value 12 would cause two of the comparators 121–127 to become activated simultaneously. The resulting summation signal on line 145 would accordingly progress from the value 3 directly to the value 5, thus "bypassing" the exact threshold value 4. However, because of the conventional action of comparator 160 in becoming itself activated when the value at its input B either equals *or exceeds* the value at its A input, the trigger signal on output line 165 would as required still be produced at that point in time when the reference function reached the appropriate median value.

It may be noted parenthetically that an analogous bypassing of the exact threshold value could also occur where, for example, an increasing reference generator had been configured to advance in discrete increments large enough to encompass not only the true Mth-largest but also at least one other data value of magnitude greater than this Mth-largest. Thus where the input set took the otherwise-unambiguous form (2, 6, 9, 11, 12, 18, 19) and the reference had been set to advance in discrete increments of two units each, the reference transition from 10 to 12 would encompass both the fourth-largest "11" and the third-largest "12." The transition would accordingly cause the comparator summation to jump from 3 to 5. If M and hence the threshold were again 4, the 3-to-5 transition would similarly again be a bypassing of the exact threshold. The "greater than" thresholding provision, however, would nevertheless enable the network to once more operate appropriately by concurrently activating trigger line 165 so as to cause the desired number "12" to exit as the system's approximation to the true median value "11."

As a final supplement to both of the foregoing discussions concerning terminology and device operation, it may additionally be noted that a number of essentially-equivalent expressions may for convenience be utilized to describe the present thresholding aspect of the operational resolution of ambiguities. Several of these expressions will be discussed in the paragraphs which follow. An appreciation of their equivalent nature, however, may be facilitated by reiterating preliminarily that with the threshold network being configured so as to become activated when the number of generated comparison-output signals is either equal to or greater than the given rank-count threshold, the network possesses the capability to correctly process both unambiguous and ambiguous data situations.

Thus a first effectively-equivalent way of describing this unambiguous/ambiguous, "equal to or greater than" processing arrangement is to alternatively state that the network is configured to make a determination of whether the produced number of comparison-output signals is *at least* equal to a predetermined ranking-condition number. It may be observed that described in these terms, the emphasis is on minimal sufficiency, a criterion which is satisfied by both the "equal to" and "greater than" conditions.

Another equivalent description is to state, for example, that the network is configured to make a determination of whether the generated sum value has *reached* the rank-count threshold. It will be apparent that the threshold is still "reached" even when it is ambiguously bypassed.

Similarly, the thresholding function may be stated as being a determination of whether a predetermined ranking-condition number of the previously-described comparison-output signals have been produced. That the functional description in these terms still equivalently covers both the "equal to" and "greater than" situations follows directly from the observation that even when the number of comparators which have become activated is *greater than* the requisite threshold number, there will still inherently be a number of activated comparators which is exactly *equal to* the subject threshold.

III. Operational Advantages

When as in the above example the number R of inputs is odd and M is made equal to the quantity ((R+1)/2), the described general network becomes a median filter which outputs a data value that typically has an equal number of other subject input data values both greater than and less than itself. A special advantage of such a median filter implemented as described in the figure-depicted example mechanization is its ability to generate the median value at real-time data rates.

The preceeding description has presented in detail an exemplary preferred embodiment of the claimed invention. It will be apparent to those skilled in the art that numerous other alternative embodiments encompassing many variations may readily be employed without departing from the spirit and scope of the invention as set forth in the appended claims, in which:

What is claimed is:

1. Apparatus for generating a signal which closely approximates the Mth-largest of a set of R applied data signals, where the possible values of said applied signals can extend over a total interval T, this apparatus comprising:
   (A) input storage means, for receiving and accessibly storing the subject set of R data signals;
   (B) reference-generator means, for providing a reference signal whose values scan over said total interval T, with at least one such scan occurring for each data set applied;
   (C) comparison means, responsive to said reference signal and to said applied data signals,
      (1) for comparing each of the applied data signals to said reference signal, and
      (2) for producing each of a plurality of R distinct comparison-output signals, any given one of said comparison-output signals being produced upon the occurrence of a condition in which the value of said reference signal has become equal to or has scanned past the value of a given one of the data signals;
   (D) threshold means, responsive to said comparison-output signals,
      (1) for determining whether the produced number of said comparison signals is equal to a predetermined ranking-condition number; and
      (2) for generating a threshold-output signal when said produced number of comparison-output signals is equal to said predetermined ranking-condition number; and
   (E) sampling means, responsive to said reference signal and to said threshold-output signal, for sampling said reference signal and for outputting an ordinal-output signal corresponding to the value which said reference-generator produces at the time of the generation of said threshold-output signal;

whereby said ordinal-output signal closely approximates that particular input data signal which is the Mth-largest of the R applied signals.

2. An apparatus according to claim 1 in which:
   (A) said comparison means includes:
      (1) a plurality of R reference-comparison means, all of said reference-comparison means receiving said reference signal, and each of said comparison means receiving a single and mutually-different one of said data signals, each of said comparison means generating a unique one of said distinct comparison-output signals whenever the value of said reference signal has become equal to or has scanned past the value of the associated one data signal, where all of said output signals are of equal magnitude; and
   (B) said threshold means includes:
      (1) summation means, having a sum value initialized at zero before the value scan of said reference signal, and responsive to all of said comparison-output signals, said summation means forming and storing, each time a comparison output is generated, a new sum value by adding each generated one of said comparison signals to the last-formed sum;
      (2) selectable-threshold-generator means, for producing a rank-count threshold signal indicative of said predetermined ranking-condition number;
      (3) threshold-comparison means, responsive to said sum value and to said rank-count threshold signal, said threshold means generating a trigger signal when said sum value reaches said rank-count threshold, said trigger signal serving as said threshold-output signal.

3. Apparatus for generating a signal which closely approximates the Mth-largest of a set of R applied data signals, where the possible values of said applied signals can extend over a total interval T, this apparatus comprising:
   (A) input storage means, for receiving and storing the subject set of R signals;
   (B) reference-generator means, for providing a reference signal whose values monotonically scan over said total interval T, with at least one such scan occurring for each data set applied, where said values scan from the lower end of said interval T to the interval's higher end;
   (C) a plurality of R reference-comparison means, all of said reference-comparison means receiving said reference signal, and each of said comparison means receiving a single and mutually-different one of said data signals, each of said comparison means generating a comparison-output signal whenever the value of said reference signal has become equal to or has scanned past the value of the associated one data signal, where all of said output signals are of equal magnitude;
   (D) summation means, having a sum value initialized at zero before the value scan of said reference signal, and responsive to all of said commparison-output signals, said summation means forming and storing, each time a comparison output is generated, a new sum value by adding each generated one of said comparison signals to the last-formed sum;
   (E) selectable-threshold-generator means, for producing a rank-count threshold signal indicative of the ranking quantity (R−M+1);

(F) threshold-comparison means, responsive to said sum value and to said rank-count threshold signal, said threshold means generating a trigger signal when said sum value reaches said rank-count threshold signal; and (G) sampler means, responsive to said trigger signal and to said reference signal, for sampling said reference signal and for storing and outputting an ordinal-output signal corresponding to the value produced by said reference-generator means at the time when said sum value reaches said rank-count threshold signal;

whereby said ordinal-output signal closely-approximates that particular input data value which is the Mth-largest of the R applied values.

4. Apparatus for generating a signal which closely approximates the Mth-largest of a set of R applied data signals, where the possible values of said applied signals can extend over a total interval T, this apparatus comprising:

(A) input storage means, for receiving and storing the subject set of R signals;

(B) reference-generator means, for providing a reference signal whose values monotonically scan over said total interval T, with at least one such scan occurring for each data set applied, where said values scan from the higher end of said interval T to the interval's lower end;

(C) a plurality of R reference-comparison means, all of said reference-comparison means receiving said reference signal, and each of said comparison means receiving a single and mutually-different one of said data signals, each of said comparison means generating a comparison-output signal whenever the value of said reference signal has become equal to or has scanned past the value of the associated one data signal, where all of said output signals are of equal magnitude;

(D) summation means, having a sum value initialized at zero before the value scan of said reference signal, and responsive to all of said comparison-output signals, said summation means forming and storing, each time a comparison output is generated, a new sum value by adding each generated one of said comparison signals to the last-formed sum;

(E) selectable-threshold-generator means, for producing a rank-count threshold signal indicative of the ranking quantity M;

(F) threshold-comparison means, responsive to said sum value and to said rank-count threshold signal, said threshold-comparison means generating a trigger signal when said sum value reaches said rank-count threshold signal; and (G) sampler means, responsive to said trigger signal and to said reference signal, for sampling said reference signal and for storing and outputting an ordinal-output signal corresponding to the value produced by said reference-generator means at the time when said sum value reaches said rank-count threshold signal;

whereby said ordinal-output signal closely approximates that particular input data value which is the Mth-largest of the R applied values.

5. Apparatus according to either of claims 3 or 4 in which:

(1) said apparatus further includes: control generator means, this means being (a) connected to said sampler means and to said summation means, for initializing both said sampler means and said summation means by clearing their existing values; and (b) connected also to said input storage means, for initializing said input storage means so as to accommodate a new set of R applied data signals; and in which (2) said reference-generator means is adapted to provide said reference signal periodically, the start of the period coinciding with the receipt of said applied data signals;

whereby said apparatus becomes adapted to produce a succession of ordinal-output signals in response to a successive application of a sequence of data-signal sets.

6. Apparatus for generating a signal which closely approximates the Mth-largest of a set of R applied data signals, where the possible values of said applied signals can extend over a total interval T, this apparatus comprising:

(A) input storage means, for receiving and accessibly storing the subject set of R data signals;

(B) reference-generator means, for providing a reference signal whose values scan over said total interval T, with at least one such scan occurring for each data set applied;

(C) comparison means, responsive to said reference signal and to said applied data signals, (1) for comparing each of the applied data signals to said reference signal, and (2) for producing each of a plurality of R distinct comparison-output signals, any given one of said comparison-output signals being produced upon the occurrence of a condition in which the value of said reference signal has become equal to or has scanned past the value of a given one of the data signals;

(D) threshold means, responsive to said comparison-output signals, (1) for determining whether a predetermined ranking-condition number of said comparison-output signals have been produced; and (2) for generating a threshold-output signal when said predetermined number of said signals have been produced; and (E) sampling means, responsive to said reference signal and to said threshold-output signal, for sampling said reference signal and for outputting an ordinal-output signal corresponding to the value which said reference-generator produces at the time of the generation of said threshold-output signal;

whereby said ordinal-output signal closely approximates that particular input data signal which is the Mth-largest of the R applied signals.

7. Apparatus for generating a signal which closely approximates the Mth-largest of a set of R applied data signals, where the possible values of said applied signals can extend over a total interval T, this apparatus comprising:

(A) input storage means, for receiving and accessibly storing the subject set of R data signals;

(B) reference-generator means, for providing a reference signal whose values scan over said total interval T, with at least one such scan occurring for each data set applied;

(C) comparison means, responsive to said reference signal and to said applied data signals,
  (1) for comparing each of the applied data signals to said reference signal, and
  (2) for producing each of a plurality of R distinct comparison-output signals, any given one of said comparison-output signals being produced upon the occurrence of a condition in which the value of said reference signal has become equal to or has scanned past the value of a given one of the data signals;
(D) threshold means, responsive to said comparison-output signals,
  (1) for determining whether the produced number of said comparison signals is at least equal to a predetermined ranking-condition number; and
  (2) for generating a threshold-output signal when said produced number of signals is at least equal to said predetermined number; and
(E) sampling means, responsive to said reference signal and to said threshold-output signal, for sampling said reference signal and for outputting an ordinal-output signal corresponding to the value which said reference-generator produces at the time of the generation of said threshold-output signal;
whereby said ordinal-output signal closely approximates that particular input data signal which is the Mth-largest of the R applied signals.

8. An apparatus according to either of claims 6 or 7 in which:
(A) said comparison means includes:
  (1) a plurality of R reference-comparison means, all of said reference-comparison means receiving said reference signal, and each of said comparison means receiving a single and mutually-different one of said data signals,
  each of said comparison means generating a unique one of said distinct comparison-output signals whenever the value of said reference signal has become equal to or has scanned past the value of the associated one data signal, where all of said output signals are of equal magnitude; and
(B) said threshold means includes:
  (1) summation means, having a sum value initialized at zero before the value scan of said reference signal, and responsive to all of said comparison-output signals,
  said summation means forming and storing, each time a comparison output is generated, a new sum value by adding each generated one of said comparison signals to the last-formed sum;
  (2) selectable-threshold-generator means, for producing a rank-count threshold signal indicative of said predetermined ranking-condition number;
  (3) threshold-comparison means, responsive to said sum value and to said rank-count threshold signal, said threshold means generating a trigger signal when said sum value reaches said rank-count threshold, said trigger signal serving as said threshold-output signal.

* * * * *